United States Patent [19]
Dent

[11] Patent Number: 5,070,303
[45] Date of Patent: Dec. 3, 1991

[54] LOGARITHMIC AMPLIFIER/DETECTOR DELAY COMPENSATION

[75] Inventor: Paul W. Dent, Stehag, Sweden

[73] Assignee: Telefonaktiebolaget L M Ericsson, Stockholm, Sweden

[21] Appl. No.: 570,607

[22] Filed: Aug. 21, 1990

[51] Int. Cl.$^5$ .................. G01K 15/10; G06G 7/12
[52] U.S. Cl. ................................ 328/145; 307/492; 307/603
[58] Field of Search .............. 328/145; 307/492, 603

[56] References Cited

U.S. PATENT DOCUMENTS

| | | | |
|---|---|---|---|
| 3,403,347 | 9/1968 | Stull | 328/145 |
| 3,423,682 | 1/1969 | Cauchois | 325/324 |
| 3,435,353 | 3/1969 | Sauber | 328/145 |
| 3,605,027 | 9/1971 | Nichols et al. | 328/145 |
| 3,668,535 | 6/1972 | Lansdowne | 328/145 |
| 3,745,374 | 7/1973 | Hecker et al. | 307/230 |
| 3,745,474 | 7/1973 | Hughes | 307/492 |
| 4,090,150 | 5/1978 | Vachenauer | 328/145 |
| 4,442,549 | 4/1984 | Main | 455/211 |
| 4,551,688 | 11/1985 | Craiglow | 330/280 |
| 4,574,251 | 3/1986 | Jason | 330/279 |
| 4,716,316 | 12/1987 | Colin | 307/492 |
| 4,780,681 | 10/1988 | Dahlman | 328/55 |
| 4,797,586 | 1/1989 | Traa | 307/603 |
| 4,972,512 | 11/1990 | Garskamp | 307/492 |

Primary Examiner—Stanley D. Miller
Assistant Examiner—Toan Tran
Attorney, Agent, or Firm—Burns, Doane, Swecker & Mathis

[57] ABSTRACT

An amplifier/detector chain logarithmically amplifies an input signal as well as compensates for delays generated by necessary bandwidth restrictions. A plurality of amplifiers are connected in series and grouped in amplifier stages with each stage having at least one amplifier. In between each amplfier stage is a filter which restricts the bandwidth of signals to frequencies in a desired signal range. When an amplifier stage includes more than one amplifier, a local summer sums the outputs detected by detectors associated with each amplifier in a particular stage. When an amplifier stage includes only a single amplifier associated detector, the local sum signal for the stage is simply the detector output. No local summer is required. Because of the time delay introduced by each interposed filter, each local sum is input to a corresponding compensating device which compensates for the associated time delay. Each compensating device stores its corresponding local sum until the local sum from the final stage is ready to be output. When all of the local summer outputs have been time-aligned or brought in phase, the local sums are connected from their corresponding compensating devices to a central summer stage. The output of the central summer represents the instantaneous output of the logarithmically amplified input signal.

19 Claims, 3 Drawing Sheets

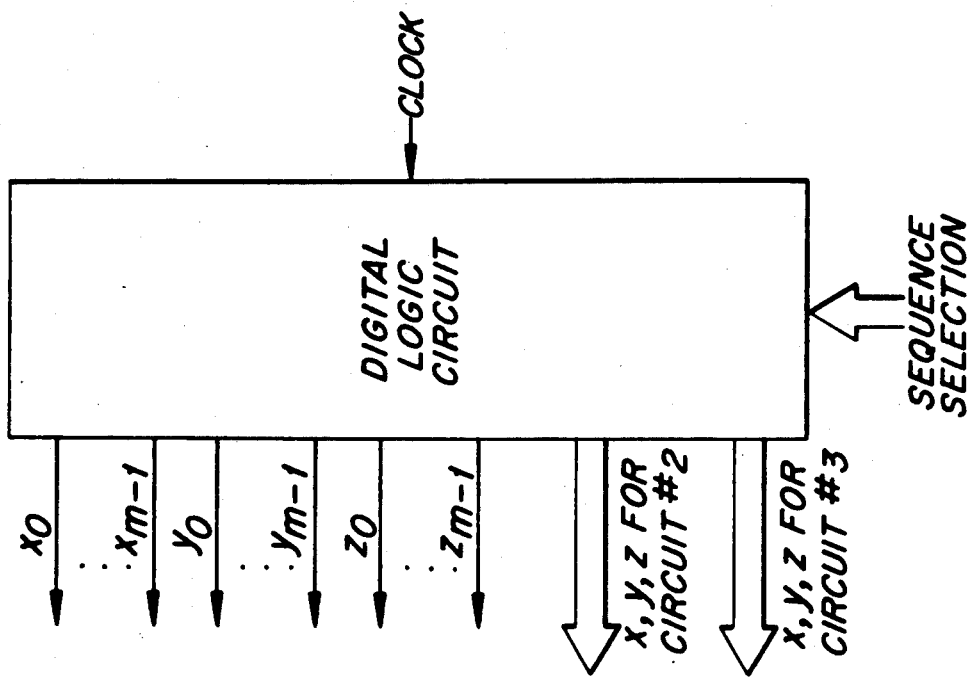
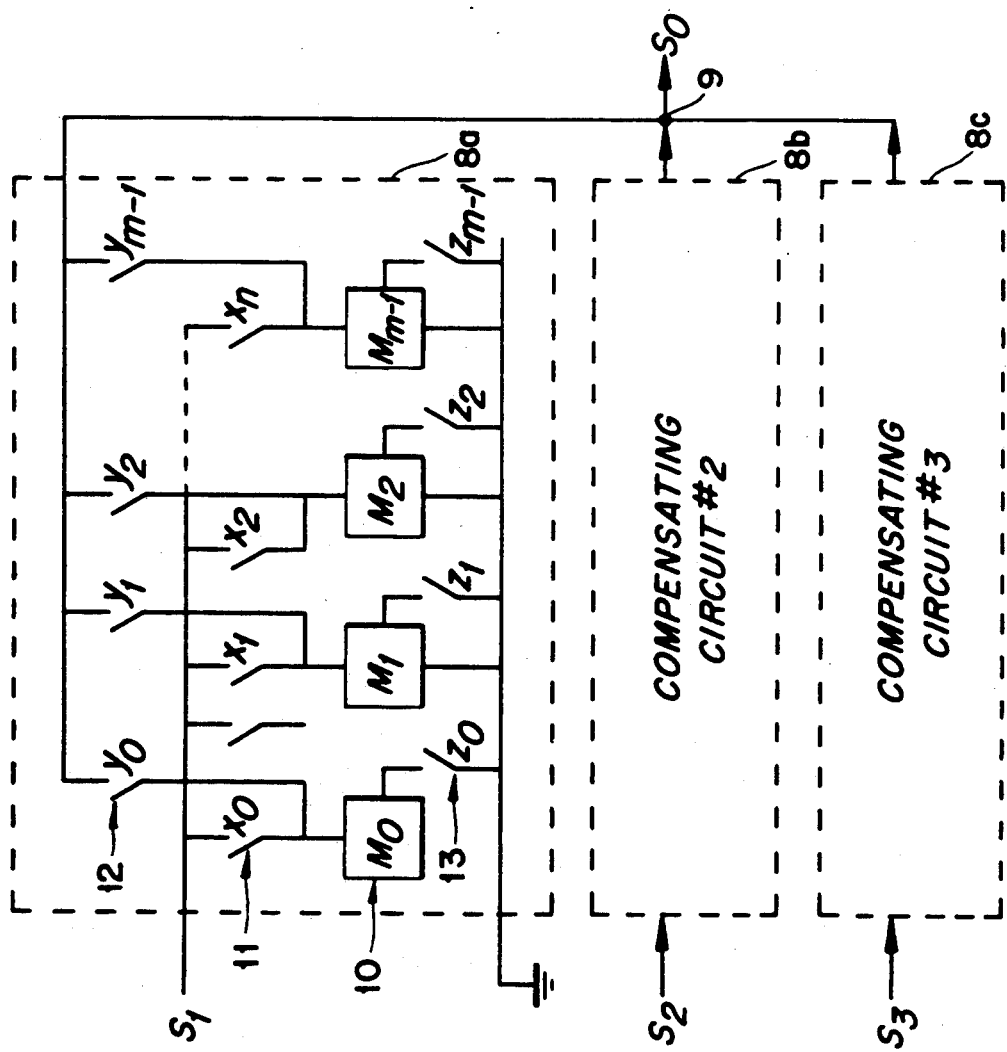

LOGARITHMIC AMPLIFIER/DETECTOR DELAY COMPENSATION

FIELD OF INVENTION

The present invention relates to logarithmic amplifiers for use in pulse receiver systems, and more particularly to a system for compensating for time delays in radio signal amplifier/detector chains.

BACKGROUND OF THE INVENTION

The strength or amplitude of a received radio signal is typically measured by a device commonly known as a detector. In its simplest form, a detector may be a diode rectifier which converts an A.C. radio signal to a D.C. voltage proportional to the amplitude of the radio signal. In practice, the detector has a minimum signal level below which it will not produce a usable output. Accordingly, amplifiers are employed to generate a detectable signal. Another constraint is that the maximum detectable signal is limited both by the detector's breakdown voltage and an individual amplifier's saturation voltage. The detector's dynamic signal range is defined by these minimum and maximum signal levels.

To overcome limitations in the detector's dynamic range, logarithmic amplifiers are used. Logarithmic radio frequency (RF) amplifiers typically employ a chain of RF amplifiers of similar gain for cascade amplification of the input signal. Each amplifier provides an output that is a substantially linear function of the input signal until the input signal reaches a sufficient amplitude to saturate that amplifier. When this amplitude level is reached, the output of the amplifier remains constant at that limiting amplitude despite increases in the input signal level. Typically, if the signal level is very small, only by the final amplifier stage would the signal level have reached a detectable level. Conversely, if the signal level is large, the amplifiers will saturate in reverse order beginning with the last amplifier.

A significant problem with using a logarithmic amplifier chain having a large number of stages and a high total gain is the amplification of noise signals over a wide frequency range. In the absence of an input signal, internal amplifier noise could drive the later amplifier stages into saturation. In order to prevent premature saturation caused by wideband noise and to allow higher overall gain, the bandwidth must be restricted. One or more filters can be interposed between amplifier stages to limit the bandwidth so that only frequencies at or near the input signal frequency are amplified. In addition, to avoid instability caused by feedback between the input and output of a long amplifier chain, one or more frequency conversions may be required in the middle of such a chain in order to split the total desired amplification over different intermediate frequencies. The use of heterodyne mixers to effect frequency conversion may also involve bandwidth restricting filters to suppress unwanted frequency outputs or other spurious responses.

Unfortunately, the restriction of bandwidth necessarily introduces a time delay in the signal. For example, inserting a bandwidth limiting filter between first and second amplifier stages delays the output signal from the first stage to the second stage by a certain time period. Bandwidth restrictions in a logarithmic amplifier chain cause successive time delays in the responses of successive detector stages. Consequently, the sum of the detected outputs no longer represents the logarithm of the instantaneous signal amplitude.

Accordingly, it is desirable to provide a logarithmic amplifier/detector that overcomes the limitations of prior logarithmic amplifiers. Specifically, it is desirable to restrict the bandwidth of amplified signals and at the same time compensate for the resulting time delay in order to reduce transient distortion.

SUMMARY OF THE INVENTION

The present invention resides in an amplifier/detector chain designed to logarithmically amplify an input signal as well as compensate for delays generated by necessary bandwidth restrictions. A plurality of amplifiers are connected in series and grouped in amplifier stages with each stage having at least one amplifier. In between each amplifier stage is a filter which restricts the bandwidth of signals which it will amplify to frequencies in the desired input signal range. When an amplifier stage includes more than one amplifier, a local summer sums the outputs detected by detectors associated with each amplifier in a particular stage. When an amplifier stage includes only a single amplifier and associated detector, the local sum signal for the stage is simply the detector output. No local summer is required. Because of the time delay introduced by each interposed filter, each local sum is input to a corresponding compensating device which compensates for the associated time delay. Each compensating device stores its corresponding local sum until the local sum from the final stage is ready to be output. When all of the local summer outputs have been time-aligned or brought in phase, the local sums are connected from their corresponding compensating devices to a central summer stage. The output of the central summer represents the instantaneous output of the logarithmically amplified input signal.

BRIEF DESCRIPTION OF THE DRAWINGS

These and other features and advantages of the invention will be readily apparent to one of ordinary skill in the art from the following written description, read in conjunction with the drawings, in which:

FIGS. 3a and 3b are more detailed schematic view of a system for implementing the present invention.

DETAILED DESCRIPTION OF THE PREFERRED EMBODIMENTS

Figure 1:
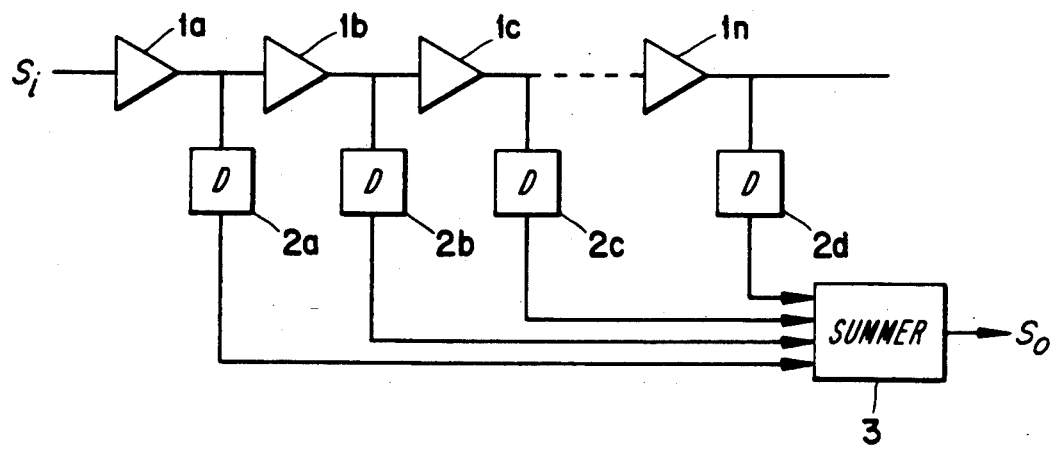
FIG. 1 is a general schematic view of a logarithmic amplifier/detector chain.

To further facilitate an understanding of the invention, a conventional logarithmic amplifier is described with reference to FIG. 1. An input radio signal $S_i$ is received by a first amplifier 1a which amplifies the input signal by a suitable gain factor. The output of the amplifier 1a is detected by a detector 2a and received as an input signal by the next amplifier 1b. Each detector output is connected to a central summing device 3 which generates an amplified output signal $S_o$.

Figure 2:
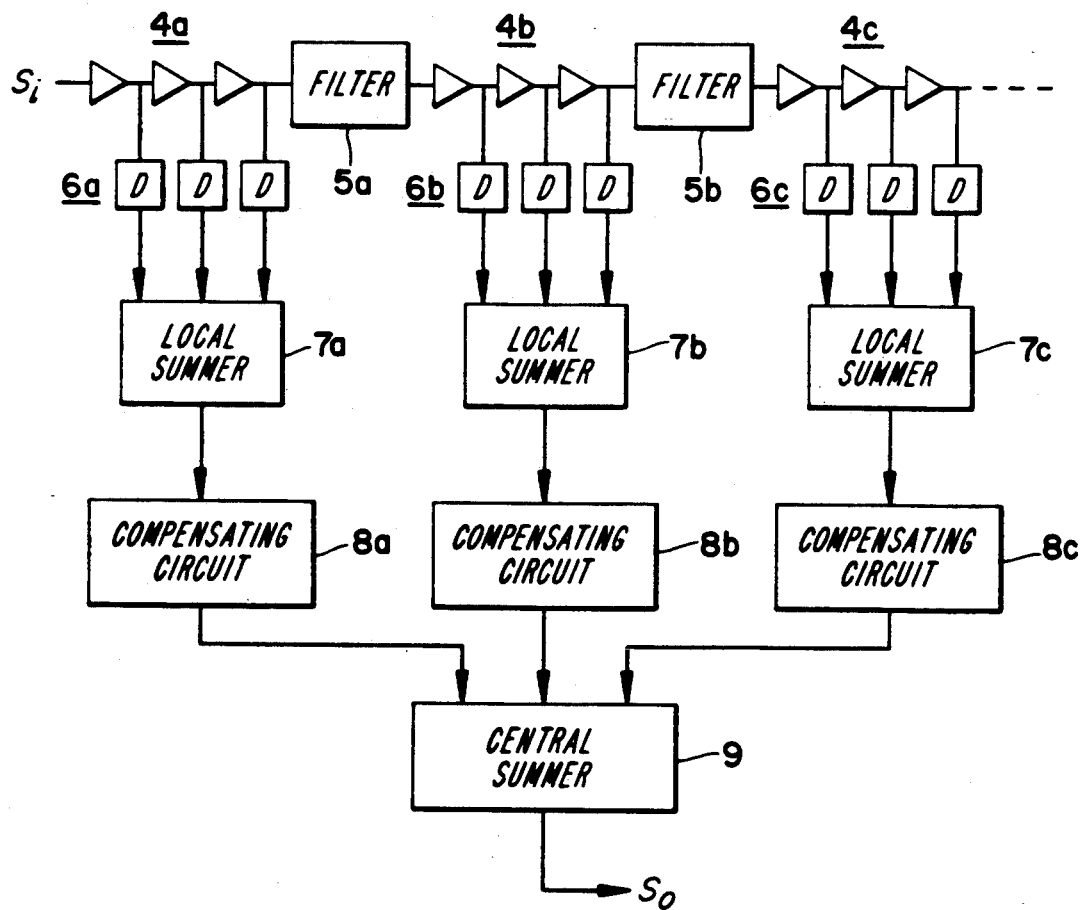
FIG. 2 is a general schematic view of a system for implementing the present invention.

FIG. 2 shows a general schematic of a system for implementing the present invention. It will be appreciated, however, that specific applications of the invention are not limited to radio receiver detectors. Rather, the present invention is applicable to any situation where it is desirable to compensate for propagation delays in an amplifier chain.

An input signal $S_i$ is fed to a first stage of amplifiers 4a. Each stage of amplifiers, represented in the drawings by three individual amplifiers, has at least one amplifier but may contain more than one amplifier. In the preferred embodiment, each stage of amplifiers contains plural amplifiers. The output of each amplifier in stage 4a is connected to a respective detector 6a. Each detector 6a is typically a half wave rectifier. At this point it should be made clear that when an amplifier stage includes more than one amplifier, a local summer 7a sums the output detected by each detector 6a associated with each amplifier. When an amplifier stage includes only a single amplifier and associated detector, the local sum signal for that stage is simply the detector output. No local summer is required. The output of the local summer 7a is input to a compensating circuit 8a. The output of compensating circuit 8a becomes one of several inputs to a central summing device 9. The signal output So of the central summing device 9 represents the output of the logarithmic amplifier chain.

Interposed between each local amplifier stage is a filter. For example, a filter 5a is interposed between local amplifier stages 4a and 4b. Likewise, a filter 5b is interposed between local amplifier stages 4b and 4c. The system in the FIG. 2 shows three individual amplifier, detector, summing, and compensating stages which then connect to a central summing device. Of course, additional stages could be used in the present invention.

As discussed previously, each filter interposed between the local amplifier stages introduces a corresponding delay. In this example, it is assumed that the only significant delays are caused by the filters and not the amplifiers themselves. Accordingly, the three locally summed signals S1, S2, S3 are delayed relatively by the time delay period T1 arising in filter F1, which delays signals S2 and S3, and time delay period T2 in filter F2 which further delays signal S3. Assuming the time delay periods are substantially equivalent, the local sum S1 is out of phase by two time delay periods, and the local sum S2 is out of phase by a single time delay period. Since negative delays are scientifically impossible to accomplish, the local sum S2 must be delayed by time delay period T2 and local sum S1 must be delayed by two time delay periods T1+T2 to time-align them with local sum S3.

Consequently, if there are "n" amplifier stages, the output of the i-th amplifier stage will be delayed by $(n-i)$ time periods $T(i)+T(i+1)+\ldots+T(n-1)$, where "T(i)" is the filter delay between the i-th and (i+1)-th amplifier stages. For example, if n=3 and i=1, the local sum S1 will be delayed by $(3-1)=2$ time periods.

FIG. 3 is a more detailed schematic diagram of a circuit incorporating the principles of the invention. The first signal to be delayed, local sum S1, is fed through a bank of electrically controlled switches 11 (x0, x1, x2, x3 ... xn) to a bank of memories 10 (Mo, M1, M2, M3 ... Mn). Each memory can be a simple capacitor which is charged to a value proportional to the value of the signal to be stored. Of course, other suitable memory devices can be used. A second bank of switches 12 (y0, y1, y2 ... yn) connects one of the memories to the central summer 9. A third bank of switches 13 (z0, z1, z2 ... zn) may optionally be provided to allow the individual memories to be reset. Where the memories are capacitors, closing the resetting switch fully discharges the capacitor.

The local sum S2 is also connected to a similar set of switches and memories. Each successive compensating circuit has its corresponding set of switches and memories. All of the electrically controlled switches may be opened or closed under the control of a conventional digital logic unit 14.

In operation, the digital logic unit is programmed to operate the switches in each stage in the following sequence selection:

1) Open switch $x(|k-1|m)$
2) Open switch z(k), if implemented
3) Close switch x(k)
4) Open switch $y(|k-j-1|m)$
5) Close switch $y(|k-j|m)$
6) Close switch $z(k-j-1|m)$ if implemented
7) $k=|k+1|m$
8) go to step (1)

where $||m$ signifies a modulo$_m$ evaluation of the expression;

m—1 represents the total number of switch/memory combinations;

k represents the number of the current iteration or time period; and j represents the number of delay units (or the amount of delay) necessary to time align the output of a particular stage with the time-aligned outputs of the other stages at the input to the final summer.

For each stage, the current signal to be delayed is cyclically applied to the memories 10. Meanwhile, a memory previously loaded with the value of the corresponding local sum at a time j iterations earlier is connected to the central summer 9. The memory that was connected one time period earlier to the summer 9 may be reset by its associated z switch, if desired. This resetting process is desirable in situations where the electrical memories are implemented by capacitors which are charged by signal currents from the local summers S1, S2 and S3, as described above.

As an example, consider the situation where there are three different local summing stages, S1, S2 and S3. Looking just at the first stage S1, it is clear that S1 needs to be delayed for two time periods in order to time align the first summing stage output S1 with the final stage output S3. Accordingly, j=2 for this stage. Stage S2 of course would have a delay of one time period, j=1, and the final stage S3 would have no delay, j=0. For three stages the following sequence would occur in the compensating device 8a of stage one:

At time period t1, k=0 and j=2

(1) x(0−1) which is the same as x(m−1), using modulo-m circular arithmetic, is opened
(2) z(0) is opened, resetting M0 so that M0 may be re-used
(3) x(0) is closed, storing $S_1$ in M0
(4) y(0−2−1) or y(m−3) is opened, disconnecting M(m−3) from the central summer
(5) y(0−2) or y(m−2) is closed, connecting M(m−2) to the central summer
(6) z(0−2−1) is closed, resetting M(m−3)
(7) K=0+1=1
(8) go back to (1)

At time period t2, k=1 and j=2:

(1) x(1−1) or x(0) is opened
(2) z(1) is opened, resetting M1 so that M1 may be re-used (3) x(1) is closed, storing S1 at time t2 in M1
(4) y(1−2−1 or y(m−2)) is opened, disconnecting M(m−2) from the central summer
(5) y(1−2) or y(m−1) is closed, connecting M(m−1) to the central summer
(6) z(1−2−1) or y(m−1) is closed, resetting M(m−2),
(7) k=1+1=2
(8) go back to (1)

At time period t3, k=2 and j=2
(1) x(2−1)=x(1) is opened
(2) z(2) is opened, resetting M2 so that M2 may now be reused
(3) x(2) is closed, storing S1 at time t3 in M2
(4) y(2−2−1) or y(m−1) is opened, disconnecting M(m−1) from central summer
(5) y(2−2)=y(0) is closed, connecting M0 to the central summer, thus outputting at time t3 the value of S1 at time t1 which was stored in M0
(6) z(2−2−1) is closed; resetting M(m−1)
(7) k=2+1=3

Accordingly, this stage has completed cycling one local sum to the central summer 9.

The j stages of delay obtained for each stage may be adjusted to a desired value either by varying j in steps of one unit, by varying the rate at which the digital logic circuit 14 cyclically opens and closes the switches, or by varying the relative clock phase by which the x switches are closed in step (3) compared to the phase on which y switches are closed at step (5). The adjustment of the achieved delay j for each stage may be accomplished easily by programming the digital logic unit 14 in accordance with steps (1)-(8) for each stage. At the specified time, output signals corresponding to the appropriate electrically-controlled switch, are output from the digital logic circuit 9 and connected to the appropriate switch as indicated in FIG. 3.

In a preferred embodiment of the invention, adjustment of the delay period to match the number of delays introduced in the various amplifier stages is achieved by the digital logic circuit 14 using two separate adjustment modes: a coarse mode and a fine mode. The coarse adjustment is accomplished for each stage by selecting a value of j to equal the number of memory stages between the closing of the x switch and the closing of the y switch for a particular memory. Fine adjustment is effected by varying the relative clock phase between the x and y switch actions. By varying the relative phase between the switch actions, delays of a fraction of a time period may be added to or subtracted from the coarse adjustment.

Figure 4:
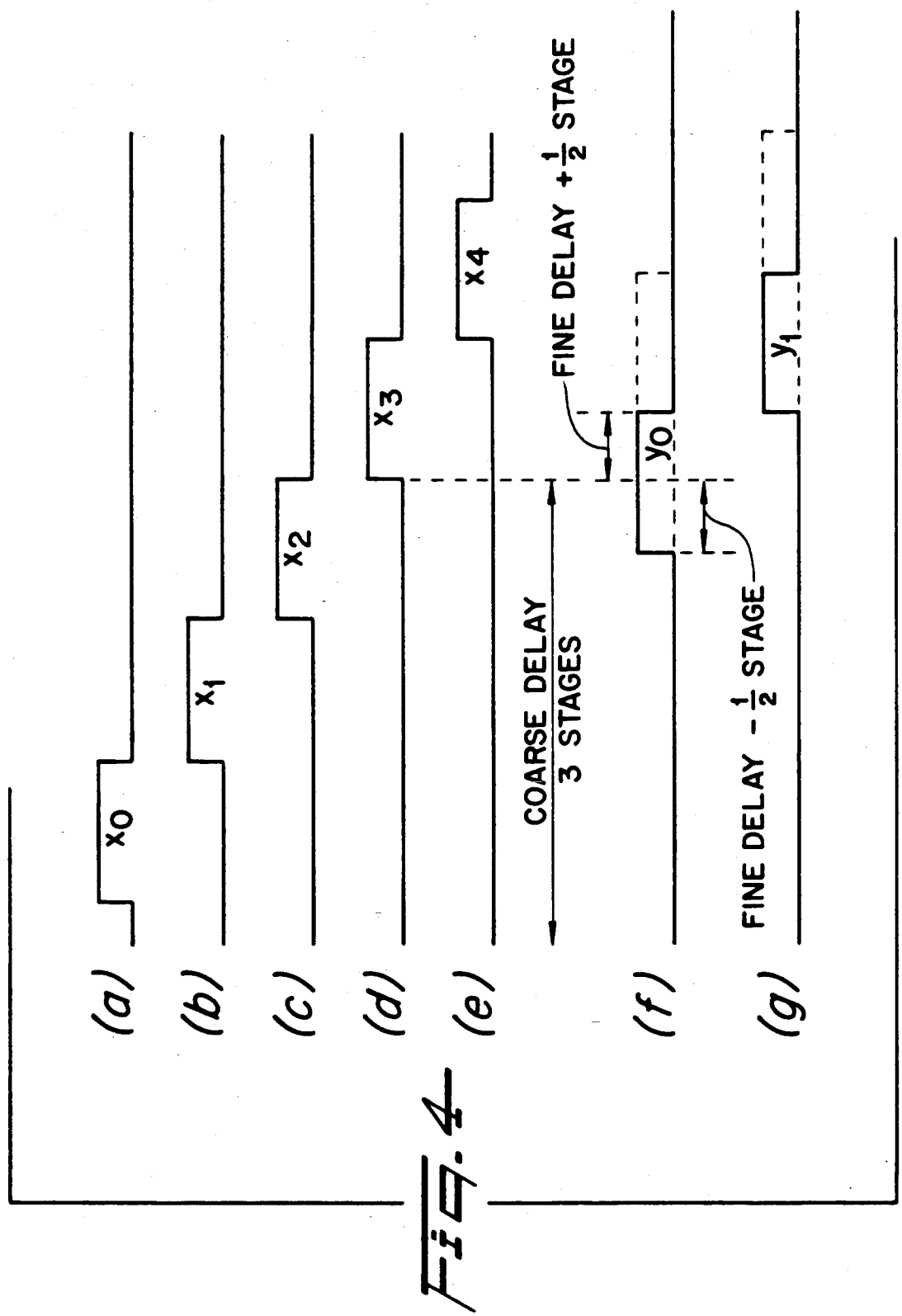
FIG. 4 is a timing diagram which shows various wave-forms useful in understanding the present invention.

An example of coarse and fine adjustment is described in conjunction with FIG. 4. The sequential opening and closing of the x-switches and y-switches are indicated by sample waveforms (a)–(e) and (f)–(g), respectively. At the end of the pulse signal $X_2$ in the sample (c), three coarse time delay stages have occurred. An example of fine adjustment is shown in waveform sample (f). The closing of the $Y_0$ switch without fine adjustment occurs at the falling edge of signal $X_2$, corresponding to the opening of switch $X_2$. However, the digital logic circuit 14 can adjust the timing of the $Y_0$ switching signal so that switch $Y_0$ opens one-half a delay period early, as shown in the solid pulse waveform in the sample (f). Conversely, the opening of switch $Y_0$ can be further delayed an additional one-half a delay period, as shown in the dashed waveform in the sample (f). Of course, fractional delays other than one-half of a delay period could also be implemented by the digital logic circuit 14 in the fine adjustment mode.

In another preferred embodiment of the invention, the local summing stage signals S1, S2, S3 . . . which arise in the form of current signals are converted to voltage signals as well as time-aligned and summed. When capacitors are used as memories, the present invention readily lends itself to the conversion of current to voltage by adding a similar switched capacitor memory circuit for the final local summing stage (even though the final stage does not necessarily need to be delayed).

The conversion of the signal current to a suitable voltage occurs as a result of the capacitor integrating the current for one clock period dT, whereupon the voltage is given by the integral of 1/C I dT. A minimum delay of two stages is required so that three capacitors can be cyclically charged, used, then discharged prior to reuse. Consequently, the other delay circuits then need to be increased by two delay stages to preserve the desired relative time delay.

One of the advantages of using capacitor memories is that the summing of the outputs of three (or more) similar switched capacitor memory delay circuits is accomplished simply by joining their outputs together. The appropriate y switches select one capacitor memory from their respective bank to be connected to a central summing point. Rapid charge-sharing between the selected capacitors results in a voltage equal to the mean of their initial voltages, which differs from the actual sum only by a scaling factor. No additional summing circuitry is required.

The invention has been described in terms of specific embodiments to facilitate understanding; however, these embodiments are illustrative rather than limitative. It will be readily apparent to one of ordinary skill in the art that departures may be made from the specific embodiments shown above without departing from the essential spirit and scope of the invention. Therefore, the invention should not be regarded as being limited to the above examples, but should be regarded instead as being fully commensurate in scope with the following claims.

What is claimed is:

1. An apparatus for logarithmically amplifying an input signal comprising:
   a plurality of amplifiers connected in series and grouped in at least two amplifier stages said input signal being received in a first amplifier of a first amplifier stage and each amplifier stage generating an output signal;
   frequency bandwidth limiting filter means disposed between successive amplifier stages with each filter means delaying signal outputs between successive stages by a time delay period;
   compensating means associated with and responsive to at least some of said amplifier stages for compensating output signals from corresponding amplifier stages for a time delay period corresponding to an associated filter means to align said output signals in time; and
   a central summing means for summing the compensated output signals received from said compensating means.

2. The apparatus as defined in claim 1, wherein said amplifier stages include single amplifier stages having a single amplifier and multiple amplifier stages having at least two amplifiers.

3. The apparatus as defined in claim 2, further comprising a plurality of rectifiers associated with said plurality of amplifiers, each rectifier detecting an output signal from a corresponding amplifier and generating a detected output signal to which said associated compensating means is responsive.

4. The apparatus as defined in claim 3, further comprising:
   a plurality of local summing devices associated with said multiple amplifier stages for summing detected output signals of each amplifier in an associated multiple amplifier stage to generate a local sum equivalent to a total detected stage output, wherein the total detected stage output of one of said single amplifier stages is equivalent to the detected stage output, and
   wherein an associated compensating means receives the total detected stage output of an amplifier stage to compensate for an associated time delay period.

5. The apparatus as defined in claim 4, wherein said associated compensating means comprises:
   a plurality of memories connected by way of a corresponding plurality of first switches to the total detected stage output of an associated amplifier stage,
   a plurality of second switches correspondingly connecting said memories to said central summing means.

6. The apparatus as defined in claim 5, wherein each one of said compensating means receives control signals from a digital logic circuit programmed to selectively activate and deactivate individual ones of said first and second switches based on said associated time delay.

7. The apparatus as defined in claim 6, wherein said digital logic circuit compensates for said associated time delays in two adjustment modes: a first mode for achieving coarse time delay adjustment and a second mode achieving fine adjustment.

8. The apparatus as defined in claim 7, wherein during said first mode, said digital logic circuit cyclically activates and deactivates individual ones of said first and second switches to generate a predetermined number of time delay periods.

9. The apparatus as defined in claim 7, wherein during said second mode, said digital logic circuit varies the relative phase between the activation of individual ones of said first switches and the activation of individual ones of said second switches to generate time delays greater or less than one time delay period.

10. The apparatus as defined in claim 5, wherein each of said memories is a capacitor such that the charge stored in said capacitor is proportional to the value to be stored.

11. The apparatus as defined in claim 10, wherein said capacitor memories convert local sum current signals to voltage signals.

12. The apparatus as defined in claim 11, wherein said central summing means includes a means for connecting selected capacitor memories from each compensating means thereby permitting charge sharing between said selected capacitors to generate an output proportional to the sum of the outputs from each local summing device.

13. The apparatus as defined in claim 4, wherein said associated compensating means comprises:
   a plurality of delay elements such that each delay element is related to the number of time delay periods the total detected stage output from a given amplifier stage must be delayed in order to align said total detected stage output in time with the total detected stage output of a final amplifier stage.

14. The apparatus as defined in claim 4, wherein for n amplifier stages, the total detected output of the i-th amplifier stage is delayed by the sum of (n−i) time periods $$T(i)+T(i+1)+\ldots+T(n-1)j$$

where $T(i)$ is the filter delay between the i-th and the (i+1)-th amplifier stages and $i=1\ldots n$.

15. The apparatus as defined in claim 14, wherein each compensating means includes n memories connected by way of a first set of n switches to the output of an associated local summing device and by a second set of n switches to said central summing means.

16. The apparatus as defined in claim 15, further comprising a digital logic circuit for generating signals for selectively opening and closing each of said first set of n switches and each of said second set of n switches.

17. The apparatus as defined in claim 15, wherein each of said first switches may be closed to store an associated local sum in an associated memory and each of said second switches may be closed to send the associated local sum stored in the associated memory to said central summing means.

18. The apparatus as defined in claim 15, wherein each of said plurality of compensating means includes a third set of n switches connected to said n memories for selectively resetting individual ones of said memories.

19. The apparatus as defined in claim 18, further comprising a digital logic circuit for selectively opening and closing said third set of n switches.

* * * * *